United States Patent [19]
Chang

[11] Patent Number: 5,643,407
[45] Date of Patent: Jul. 1, 1997

[54] SOLVING THE POISON VIA PROBLEM BY ADDING $N_2$ PLASMA TREATMENT AFTER VIA ETCHING

[75] Inventor: Hsien-Wen Chang, Hsin-Chu, Taiwan

[73] Assignee: Taiwan Semiconductor Manufacturing Company, Ltd., Hsin-Chu, Taiwan

[21] Appl. No.: 316,096

[22] Filed: Sep. 30, 1994

[51] Int. Cl.$^6$ .................................................. H01L 21/465
[52] U.S. Cl. ............................. 156/644.1; 156/657.1; 437/228; 437/231; 437/978
[58] Field of Search ........................ 156/644.1, 657.1; 437/228, 231, 238, 978, 195

[56] References Cited

U.S. PATENT DOCUMENTS

| | | | |
|---|---|---|---|
| 5,003,062 | 3/1991 | Yen | 437/231 |
| 5,219,792 | 6/1993 | Kim et al. | 437/195 |
| 5,266,525 | 11/1993 | Morozumi | 437/195 |
| 5,320,983 | 6/1994 | Ouellet | 437/231 |
| 5,334,332 | 8/1994 | Lee | 252/548 |
| 5,393,702 | 2/1995 | Yang et al. | 437/195 |

FOREIGN PATENT DOCUMENTS

| | | |
|---|---|---|
| 5-6939 | 1/1993 | Japan. |
| 5-121560 | 5/1993 | Japan. |

OTHER PUBLICATIONS

"Hot Carrier Aging of the MOS Transistor in the Presence of Spin–On–Glass as the Interlevel Dielectric" by Lifshitz et al. IEEE Electron Device Letters, vol. 12, No. 3, Mar. 1991, pp. 140–142.

"An Advanced Interlayer Dielectric System with Partially Converted Organic SOG by Using Plasma Treatment" by M. Matsuura et al, Jun. 8–9, 1993 VMIC Conference pp. 113–114.

*Primary Examiner*—R. Bruce Breneman
*Assistant Examiner*—Anita Alanko
*Attorney, Agent, or Firm*—George O. Saile; Rosemary L. S. Pike

[57] ABSTRACT

A new method of forming the intermetal dielectric layer of an integrated circuit is described. A thick insulating layer is formed over semiconductor device structures in and on a semiconductor substrate. A first metal layer is deposited over the thick insulating layer. The first metal layer is etched using conventional photolithography and etching techniques to form the desired metal pattern on the surface of the thick insulating layer. The intermetal dielectric layer is formed by first covering the patterned first metal layer with a layer of silicon oxide. The silicon oxide layer is covered with a layer of spin-on-glass material which is cured. A second layer of silicon oxide completes the intermetal dielectric layer. Via openings are formed through the intermetal dielectric layer to the underlying patterned first metal layer. A vacuum bake removes moisture from the exposed spin-on-glass layer within the via opening. A nitrogen plasma treatment converts the exposed spin-on-glass layer from an organic to an inorganic material. The inorganic spin-on-glass material has less moisture absorption and suppresses outgassing from the rest of the organic spin-on-glass layer, thus preventing poisoned via metallurgy. A second metal layer is deposited overlying the intermetal dielectric layer and within the via openings and fabrication of the integrated circuit is completed.

17 Claims, 2 Drawing Sheets

SOLVING THE POISON VIA PROBLEM BY ADDING N₂ PLASMA TREATMENT AFTER VIA ETCHING

BACKGROUND OF THE INVENTION

(1) Field of the Invention

The invention relates to a method of preventing poisoned via metallurgy, and more particularly, to a method of preventing poisoned via metallurgy by adding a nitrogen plasma treatment for a spin-on-glass layer in the fabrication of integrated circuits.

(2) Description of the Prior Art

The spin-on-glass materials have been used for planarization of integrated circuits. The material to be applied is thoroughly mixed in a suitable solvent. The spin-on-glass material suspended in the vehicle or solvent is deposited onto the semiconductor wafer surface and uniformly spread thereover by the action of spinning the wafer. The material fills the indentations in the integrated circuit wafer surface; that is planarization. Most of the vehicle or solvent is driven off by a low temperature baking step. Other coatings of the spin-on-glass material are applied and baked until the desired spin-on-glass layer is formed.

The final step in the making of the spin-on-glass layer is curing. Curing is a high temperature heating step to cause the breakdown of the silicate or siloxane material to a silicon dioxide like cross linked material. A cured spin-on-glass process is described in U.S. Pat. No. 5,003,062 to Yen.

In the conventional etchback process as taught by Yen U.S. Pat. No. 5,003,062, the spin-on-glass layer is etched back resulting in a poisoned via metallurgy, such as aluminum, caused by outgassing. Referring now to FIG. 1, there is illustrated a partially completed integrated circuit in which a first metal layer 12 has been deposited on a semiconductor substrate 10. The intermetal dielectric layer is typically composed of a spin-on-glass layer 16 sandwiched between silicon oxide layers 14 and 18. When a via opening is made through the intermetal dielectric sandwich layer, moisture 20 is absorbed from the atmosphere by the exposed spin-on-glass on the sidewalls of the via opening. After the second metal, typically aluminum 22, is deposited as shown in FIG. 2, the moisture 20 is released from the spin-on-glass layer 16. This moisture diffuses to the interface between the first and second metal layers causing poisoned via metallurgy.

Various methods have been suggested to overcome the poisoned via problem. U.S. Pat. No. 5,219,792 to Kim et al teaches covering the spin-on-glass edge within the via with a silicon oxide layer to prevent outgassing. "Hot-Carrier Aging of the MOS Transistor in the Presence of Spin-On Glass as the Interlevel Dielectric" by Lifshitz et al, IEEE Electron Device Letters, Vol. 12, No. 3, March 1991, pp.140–142, suggests the use of a silicon nitride cap on the cured spin-on-glass to overcome aging of the MOS transistor. "An Advanced Interlayer Dielectric System with Partially Converted Organic SOG By Using Plasma Treatment," by M. Matsuura et al, Jun. 8–9, 1993 VMIC Conference, teaches curing a spin-on-glass layer in an oxygen plasma followed by curing in a nitrogen plasma to form an inorganic spin-on-glass layer on an organic spin-on-glass layer.

SUMMARY OF THE INVENTION

A principal object of the present invention is to provide an effective and very manufacturable method of forming the intermetal dielectric layer of an integrated circuit.

Another object of the invention is to form an inorganic spin-on-glass layer on an organic spin-on-glass layer.

Another object of the present invention is to provide a method of forming the intermetal dielectric layer of an integrated circuit which does not result in poisoned via metallurgy.

In accordance with the objects of this invention a new method of forming the intermetal dielectric layer of an integrated circuit is achieved. A thick insulating layer is formed over semiconductor device structures in and on a semiconductor substrate. A first metal layer is deposited over the thick insulating layer. The first metal layer is etched using conventional photolithography and etching techniques to form the desired metal pattern on the surface of the thick insulating layer. The intermetal dielectric layer is formed by first covering the patterned first metal layer with a layer of silicon oxide. The silicon oxide layer is covered with a layer of spin-on-glass material which is cured. A second layer of silicon oxide completes the intermetal dielectric layer. Via openings are formed through the intermetal dielectric layer to the underlying patterned first metal layer. A vacuum bake removes moisture from the exposed spin-on-glass layer within the via opening. A nitrogen plasma treatment converts the exposed spin-on-glass layer from an organic to an inorganic material. The inorganic spin-on-glass material has less moisture absorption and suppresses outgassing from the rest of the organic spin-on-glass layer, thus preventing poisoned via metallurgy. A second metal layer is deposited overlying the intermetal dielectric layer and within the via openings and fabrication of the integrated circuit is completed.

BRIEF DESCRIPTION OF THE DRAWINGS

In the accompanying drawings forming a material part of this description, there is shown.

DESCRIPTION OF THE PREFERRED EMBODIMENTS

Figure 1:
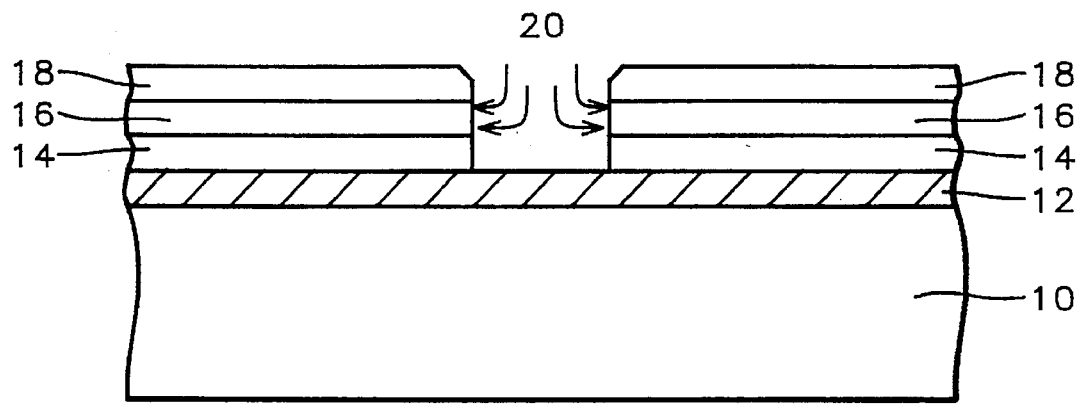
FIGS. 1 and 2 schematically illustrate in cross-sectional representation an integrated circuit of the prior art.
Figure 2:
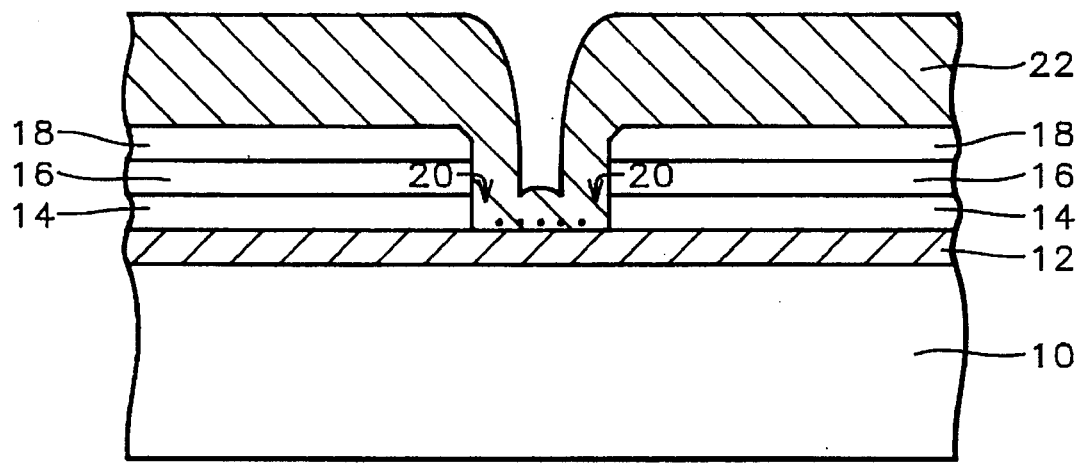
Figure 3:
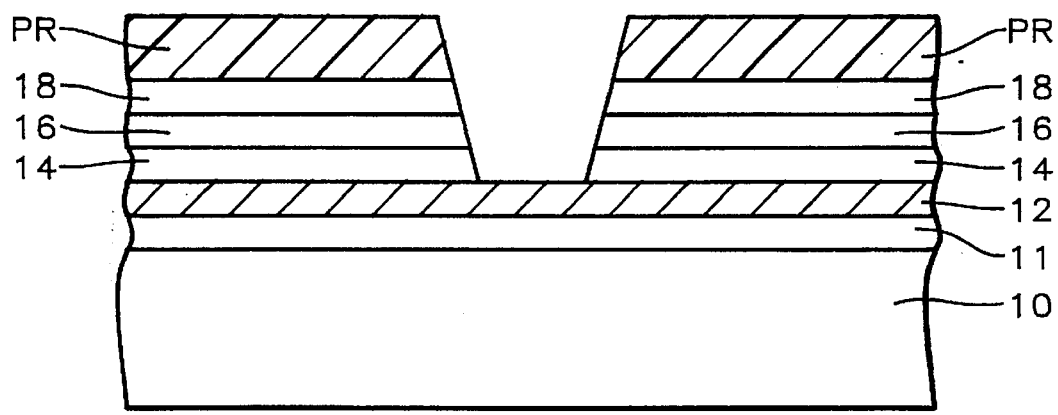
FIGS. 3 through 5 schematically illustrate in cross-sectional representation a preferred embodiment of the present invention.

Referring now more particularly to FIG. 3, there is shown a portion of a partially completed integrated circuit. The semiconductor substrate 10 is preferably composed of monocrystalline silicon. Semiconductor device structures are formed in and on the semiconductor substrate. These may be gate electrodes and source and drain regions, not shown. A thick passivation or insulating layer 11 is then formed over the surfaces of the semiconductor device structures. This layer may be composed of borophosphosilicate glass, phosphosilicate glass or similar insulating layer.

A metal 12 is sputter deposited over the surface of the insulating layer 11. This metal may include an underlying barrier metal layer, not shown. The metal layer is patterned using conventional photolithography and etching techniques to form the desired metal pattern, a portion of which is shown in FIG. 3. A conformal layer of silicon oxide 14 is deposited using plasma enhanced chemical vapor deposition (PECVD) to a thickness of between about 2000 to 3000 Angstroms. A tetraethoxysilane (TEOS) oxide or other silane-based oxide may be used. This is the first layer of the intermetal dielectric sandwich layer.

A silicate or siloxane spin-on-glass coating 16 is applied. The spin-on-glass material suspended in the vehicle or solvent is deposited onto the semiconductor wafer surface and uniformly spread thereover by the action of spinning the wafer. The material fills the indentations in the integrated circuit wafer surface; that is planarization. A double or triple coating of spin-on-glass could be used if desired. The preferred thickness of the spin-on-glass layer is between about 3000 to 4500 Angstroms. The spin-on-glass layer is cured at between about 350° to 450° C. for between 30 to 40 minutes.

Finally, the top layer of the spin-on-glass sandwich is deposited. A second layer 18 of silicon oxide is deposited by PECVD to a thickness of between about 3000 to 5000 Angstroms.

A layer of photoresist is coated over the intermetal dielectric sandwich layer and patterned to form a photoresist mask. Via openings are made through the dielectric layer to the underlying first metal layer. This is typically done with a wet etch such as a 10:1 buffered oxide etch (BOE) followed by a dry etch such as in a reactive ion etcher. Once the via etching is complete, the photoresist mask is removed using a wet strip, such as hydroxylamine followed by an $O_2$ plasma ashing at a temperature of between about 170° to 275° C. This ashing may act on the exposed spin-on-glass layer within the via opening. The $O_2$ plasma will decompose the alkyl in the organic spin-on-glass material to generate moisture. $O_2$ plasma ashing is used to make sure that all photoresist residue is removed completely. However, the $O_2$ plasma ashing is not critical to the process of the invention and need not be performed to achieve the desired prevention of poisoned via metallurgy.

Next, the critical two-step spin-on-glass treatment process of the invention will be described. The wafer is vacuum baked in a vacuum of less than about 10 mTorr at a temperature of between about 250° to 350° C. for between about 20 to 40 minutes in a nitrogen ambient. The vacuum bake removes moisture from the exposed spin-on-glass layer 16 within the via opening.

Figure 4:
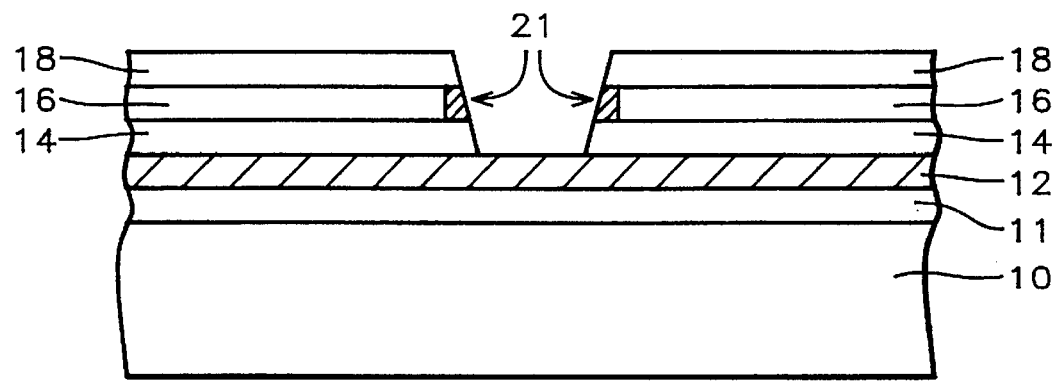

Referring now to FIG. 4, a nitrogen plasma treatment converts the exposed spin-on-glass layer within the via opening from an organic to an inorganic material 21. The inorganic spin-on-glass material will absorb less moisture from the atmosphere than does organic spin-on-glass. The preferred nitrogen atom source is $N_2$. $N_2O$ could also be used as the nitrogen atom source. The nitrogen plasma treatment includes exposure to the nitrogen source at a vacuum of between about 4 to 8 Torr at a temperature of between about 350° to 450° C., at a power of between about 180 to 220 watts for between about 10 to 50 seconds.

Figure 5:
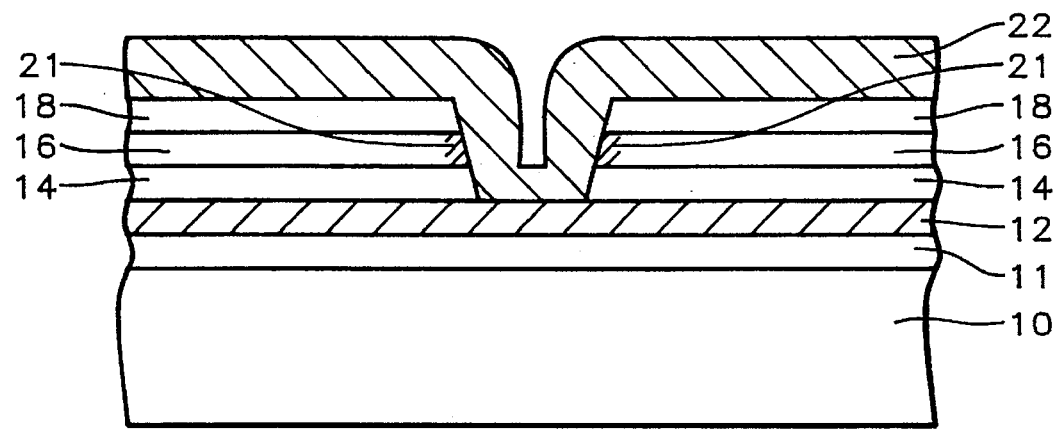

Referring now to FIG. 5, the second metallurgy 22 is sputter deposited over the surface of the wafer and within the via opening to make contact with the first metal layer 12. The inorganic material 21 on the sidewalls of the via opening prevents outgassing from the rest of the organic spin-on-glass layer. This prevents poisoned via metallurgy and provides better via contact resistance and product reliability than could be attained heretofore.

While the invention has been particularly shown and described with reference to the preferred embodiments thereof, it will be understood by those skilled in the art that various changes in form and details may be made without departing from the spirit and scope of the invention.

What is claimed is:

1. The method of forming the intermetal dielectric layer of an integrated circuit while preventing outgassing from said intermetal dielectric layer comprising:

forming semiconductor device structures in and on a semiconductor substrate;

covering said semiconductor device structures with an insulating layer;

depositing a first metal layer over said insulating layer and patterning said first metal layer;

forming said intermetal dielectric layer comprising:

covering said patterned first metal layer with a first layer of silicon oxide;

covering said first silicon oxide layer with a layer of organic spin-on-glass material and curing said organic spin-on-glass layer to form an organic spin-on-glass silicon oxide layer; and covering said organic spin-on-glass silicon oxide layer with a second layer of silicon oxide to complete said intermetal dielectric layer;

forming via openings through said intermetal dielectric layer to underlying said patterned first metal layer which thereby exposes portions of said organic spin-on-glass silicon oxide within said via openings;

vacuum baking said semiconductor substrate to remove moisture from said exposed portions of said organic spin-on-glass silicon oxide layer within said via opening;

thereafter exposing said organic spin-on-glass layer to nitrogen atoms in a vacuum of between about 4 to 8 Torr at a temperature of between about 350° to 450° C. for between about 10 to 50 seconds wherein said exposed portions of said organic spin-on-glass layer are converted to an inorganic material and wherein said inorganic material spin-on-glass layer prevents said outgassing from said intermetal dielectric layer;

depositing a second metal layer overlying said intermetal dielectric layer and within said via openings; and completing fabrication of said integrated circuit.

2. The method of claim 1 wherein said first and second silicon oxide layers are deposited by plasma enhanced chemical vapor deposition to a preferred thickness of between about 2000 to 5000 Angstroms.

3. The method of claim 1 wherein said organic spin-on-glass material has a preferred thickness of between about 3000 to 4500 Angstroms.

4. The method of claim 1 wherein said curing is performed at a temperature of between about 350° to 450° C. for between 30 to 40 minutes.

5. The method of claim 1 wherein said vacuum baking is performed in a nitrogen ambient in a vacuum of less than about 10 mTorr at a temperature of between about 250° to 350° C. for between about 20 to 40 minutes.

6. The method of claim 1 wherein said inorganic material extends into said organic spin-on-glass layer a thickness of between about 1000 to 3000 Angstroms.

7. The method of forming the intermetal dielectric layer of an integrated circuit while preventing outgassing from said intermetal dielectric layer comprising:

forming semiconductor device structures in and on a semiconductor substrate;

covering said semiconductor device structures with an insulating layer;

depositing a first metal layer over said insulating layer and patterning said first metal layer;

forming said intermetal dielectric layer comprising:

covering said patterned first metal layer with a first layer of silicon oxide;

covering said first silicon oxide layer with a layer of organic spin-on-glass material and curing said organic spin-on-glass layer to form an organic spin-on-glass silicon oxide layer; and covering said organic spin-on-glass silicon oxide layer with a second layer of silicon oxide to complete said intermetal dielectric layer;

covering said intermetal dielectric layer with a layer of photoresist and patterning said photoresist layer to form a photoresist mask;

etching via openings through said intermetal dielectric layer to underlying said patterned first metal layer using said photoresist mask wherein portions of said organic spin-on-glass silicon oxide within said via openings are exposed;

removing said photoresist mask using oxygen plasma ashing wherein said oxygen plasma ashing generates moisture within said exposed portions of said organic spin-on-glass layer within said via openings;

vacuum baking said semiconductor substrate to remove said moisture from said exposed portions of said organic spin-on-glass silicon oxide layer within said via openings;

thereafter exposing said organic spin-on-glass layer to nitrogen atoms at a vacuum of between about 4 to 8 Torr at a temperature of between about 350° to 450° C. for between about 10 to 50 seconds wherein said exposed portions of said organic spin-on-glass layer are converted to an inorganic material and wherein said inorganic material spin-on-glass layer prevents said outgassing from said intermetal dielectric layer;

depositing a second metal layer overlying said intermetal dielectric layer and within said via openings; and completing fabrication of said integrated circuit.

8. The method of claim 7 wherein said first and second silicon oxide layers are deposited by plasma enhanced chemical vapor deposition to a preferred thickness of between about 2000 to 5000 Angstroms.

9. The method of claim 7 wherein said organic spin-on-glass material has a preferred thickness of between about 3000 to 4500 Angstroms.

10. The method of claim 7 wherein said curing is performed at a temperature of between about 350° to 450° C. for between 30 to 40 minutes.

11. The method of claim 7 wherein said vacuum baking is performed in a nitrogen ambient in a vacuum of less than about 10 mTorr at a temperature of between about 250° to 350° C. for between about 20 to 40 minutes.

12. The method of claim 7 wherein said inorganic material extends into said organic spin-on-glass layer a thickness of between about 1000 to 3000 Angstroms.

13. The method of treating the intermetal dielectric layer of an integrated circuit to prevent outgassing from said intermetal dielectric layer comprising:

providing an intermetal dielectric layer overlying a patterned first metal layer overlying an insulating layer covering semiconductor device structures in and on a semiconductor substrate wherein said intermetal dielectric layer comprises a first layer of silicon oxide, a layer of organic spin-on-glass material wherein said organic spin-on-glass layer is cured, and a second layer of silicon oxide and wherein via openings have been etched through said intermetal dielectric layer to underlying said patterned first metal layer wherein portions of said organic_spin-on-glass layer within said via openings are exposed;

vacuum baking said semiconductor substrate to remove moisture from said exposed portions of said organic_ spin-on-glass layer within said via openings; and thereafter exposing said organic spin-on-glass layer to nitrogen atoms at a vacuum of between about 4 to 8 Torr at a temperature of between about 350° to 450° C. for between about 10 to 50 seconds wherein said exposed portions of said organic spin-on-glass layer are converted to an inorganic material and wherein said inorganic material spin-on-glass layer prevents said outgassing from said intermetal dielectric layer to complete treatment of said intermetal dielectric layer in the fabrication of said integrated circuit.

14. The method of claim 13 wherein said organic spin-on-glass material has a preferred thickness of between about 3000 to 4500 Angstroms.

15. The method of claim 13 wherein said organic spin-on-glass layer is cured at a temperature of between about 350° to 450° C. for between 30 to 40 minutes.

16. The method of claim 13 wherein said vacuum baking is performed in a nitrogen ambient in a vacuum of less than about 10 mTorr at a temperature of between about 250° to 350° C. for between about 20 to 40 minutes.

17. The method of claim 13 wherein said inorganic material extends into said organic spin-on-glass layer a thickness of between about 1000 to 3000 Angstroms.

* * * * *